US006954024B2

(12) United States Patent
Nguyen et al.

(10) Patent No.: US 6,954,024 B2

(45) Date of Patent: Oct. 11, 2005

(54) UNIDIRECTIONAL ACOUSTIC PROBE AND METHOD FOR MAKING SAME

(75) Inventors: Ngoc-Tuan Nguyen, Mougins (FR); Jacques Elziere, Contes (FR); René Meliga, Cagnes S/MER (FR)

(73) Assignee: Thales, Paris (FR)

( * ) Notice: Subject to any disclaimer, the term of this patent is extended or adjusted under 35 U.S.C. 154(b) by 231 days.

(21) Appl. No.: 10/204,432

(22) PCT Filed: Mar. 9, 2001

(86) PCT No.: PCT/FR01/00711

§ 371 (c)(1),
(2), (4) Date: Aug. 30, 2002

(87) PCT Pub. No.: WO01/68273

PCT Pub. Date: Sep. 20, 2001

(65) Prior Publication Data

US 2003/0011277 A1 Jan. 16, 2003

(51) Int. Cl.$^{7}$ .......................... H01L 41/04; H02N 2/00

(52) U.S. Cl. ...................... 310/334; 310/365; 310/366; 310/324; 310/330; 310/321; 310/311

(58) Field of Search ................................ 333/194, 189; 310/330, 324, 321, 366, 311, 334–337, 365; 381/114, 190; 367/155, 157

(56) References Cited

U.S. PATENT DOCUMENTS

| | | | | |
|---|---|---|---|---|
| 5,730,113 | A | 3/1998 | Wildes et al. | |
| 5,774,960 | A | 7/1998 | De Fraguier et al. | |
| 5,865,163 | A * | 2/1999 | Wildes et al. | 125/16.02 |

FOREIGN PATENT DOCUMENTS

| | | |
|---|---|---|
| FR | 2 770 932 | 5/1999 |

* cited by examiner

*Primary Examiner*—Darren Schuberg
*Assistant Examiner*—J. Aguirrechea
(74) *Attorney, Agent, or Firm*—Oblon, Spivak, McClelland, Maier & Neustadt, P.C.

(57) ABSTRACT

A unidirectional acoustic probe including a high-performance interconnection network, and a method of manufacturing such a probe. The unidirectional acoustic probe includes linear piezoelectric transducers on the surface of a dielectric film. The dielectric film includes a connection device to electrically connect the piezoelectric transducers to a control device. The connection device includes primary connection pads, facing the piezoelectric transducers, secondary connection pads, offset with respect to the piezoelectric transducers, so that the transducers can be connected to the control device, and conducting tracks connecting the primary connection pads to the secondary connection pads. The conducting tracks are in a direction perpendicular to the direction defined by a major axis of the piezoelectric transducers.

10 Claims, 5 Drawing Sheets

UNIDIRECTIONAL ACOUSTIC PROBE AND METHOD FOR MAKING SAME

BACKGROUND OF THE INVENTION

1. Field of the Invention

The field of the invention is that of probes including a set of emitting and/or receiving elements obtained by cutting from a transducer block. Such probes are currently used especially in applications such as echography. More specifically, the invention relates to unidirectional acoustic probes, including linear elements which can be excited independently of each other by virtue of an interconnection network connected to a control circuit.

2. Description of the Related Art

One method of producing these probes consists first of all in producing an assembly of a printed circuit including an interconnection network/layer of piezoelectric material/acoustic matching plates, then in cutting out the individual piezoelectric elements. International application WO 97/17145 filed by the applicant describes such a method and more particularly a method of manufacturing a probe using a printed circuit on which conducting tracks are produced, making it possible to address the various acoustic elements.

FIG. 1 actually illustrates more specifically a piezoelectric material 13 assembled to acoustic matching plates $Li_1$ and $Li_2$, said material being cut in two perpendicular directions by the standard sawcuts $T_i$ and $T_j$. A flexible printed circuit 12 includes conducting tracks PI and vias, at least part of one and the same via being positioned on a conducting track and on a metallization $M_i$ of associated piezoelectric material. In this configuration, linear acoustic pathways are defined parallel to the lines $T_j$, each acoustic pathway being subdivided into a subpathway defined parallel to the lines $T_i$. When the previously described assembly is produced, the probe is shaped, an operation making it possible to produce curved probes which are particularly sought in the echography field. To this end, the printed circuit including its individual acoustic elements may be adhesively bonded to the surface of a solid absorbing material having a curved surface. The flexible printed circuit is then folded over the edges of the ceramic and of the absorber as illustrated in FIG. 2. The acoustic pathways defined parallel to the axis X, are also parallel to the tracks PI, the printed circuit and conducting track assembly is, on the one hand, placed on the surface of the absorber ABS and, on the other hand, folded back vertically over the sides A and At of said absorber for reasons of compactness. In this configuration, the tracks are thus folded at 90° with a sharp angle which tends to weaken them or even break them.

BRIEF SUMMARY OF THE INVENTION

To solve this problem, the present invention provides an acoustic probe including a novel interconnection network produced on the surface of a flexible dielectric film making it possible during the shaping operation to optimize the overall size of the probe and the strength of the electrical connections.

More specifically, the subject of the invention is a unidirectional acoustic probe including linear piezoelectric transducers on the surface of a dielectric film, the dielectric film including elements for electrically connecting the piezoelectric transducers to a control device, characterized in that the connection elements include:

- primary connection pads, facing the piezoelectric transducers;

- secondary connection pads, offset with respect to the piezoelectric transducers, so that the transducers can be connected to the control device;
- conducting tracks connecting the primary connection pads to the secondary connection pads, the conducting tracks being in a direction $D_x$ perpendicular to the direction $D_y$ defined by the major axis of the piezoelectric transducers.

In an advantageous variant of the invention, each piezoelectric transducer includes a control electrode and a ground electrode and the dielectric film may include:

- on its upper face, first primary connection pads in contact with the control electrodes, second primary connection pads in contact with the ground electrodes and first secondary connection pads;
- on its lower face, third primary connection pads connected to the first primary connection pads by conducting vias, second secondary connection pads connected, on the one hand, to the first secondary connection pads by conducting vias and, on the other hand, to the third primary connection pads by conducting tracks, and fourth primary connection pads connected to the second primary connection pads by conducting vias.

Advantageously, the second secondary connection pads form part of a conducting region located on the periphery of the lower surface of the dielectric film forming the ground.

The subject of the invention is also a method of manufacturing acoustic probes.

More specifically, the subject of the invention is also a method of manufacturing unidirectional acoustic probes including linear piezoelectric transducers, characterized in that it includes the following steps:

- producing, on each of the faces of a dielectric film, primary connection pads intended to face piezoelectric transducers and secondary connection pads intended to be offset with respect to the piezoelectric transducers;
- producing electrical tracks connecting primary connection pads and secondary connection pads on the lower face of the film;
- adhesively bonding a layer of piezoelectric material including metallizations, to the upper face of the dielectric film;
- cutting the layer of piezoelectric material in a first dielectric so as to define the linear piezoelectric transducers, the first direction being perpendicular to a second direction parallel to the conducting tracks.

Advantageously, the operation of cutting the linear acoustic elements is carried out down to the dielectric film.

The subject of the invention is also a method of collectively manufacturing acoustic probes, characterized in that it includes:

- producing, on the surface of a dielectric film, a set of primary connection pads, secondary connection pads and conducting tracks connecting the primary connection pads to the secondary connection pads;
- assembling a set of layers of piezoelectric material and layers of acoustic matching material, over the set of connection pads so as to define a set of acoustic probes on the surface of the dielectric film;
- cutting layers of piezoelectric material and layers of acoustic matching material so as to define a set of probes including linear piezoelectric transducers;
- cutting sets of dielectric film/linear piezoelectric transducers so as to individualize the unidirectional acoustic probes.

BRIEF DESCRIPTION OF THE DRAWINGS

The invention will be better understood and other advantages will become apparent on reading the following description given by way of non-limiting example with reference to the appended figures, in which.

DETAILED DESCRIPTION OF THE INVENTION

The invention will be described in the case of a particular example of a unidirectional probe including eight linear transducers but is applicable whatever the number N of linear transducers.

In general, the probe according to the invention includes a flexible dielectric film, hereinafter called a flexible printed circuit (because of the electrical connections which are produced thereon), on which various connection pads are produced making it possible to address the piezoelectric transducers. The connection pads facing the transducers are called primary connection pads, and the connection pads offset with respect to the transducers are called secondary connection pads.

Conventionally, each piezoelectric transducer includes a ground electrode $E_{mi}$ and a control electrode $E_{ci}$, otherwise called a "hot spot" in the field of ultrasound sensors.

Figure 1:
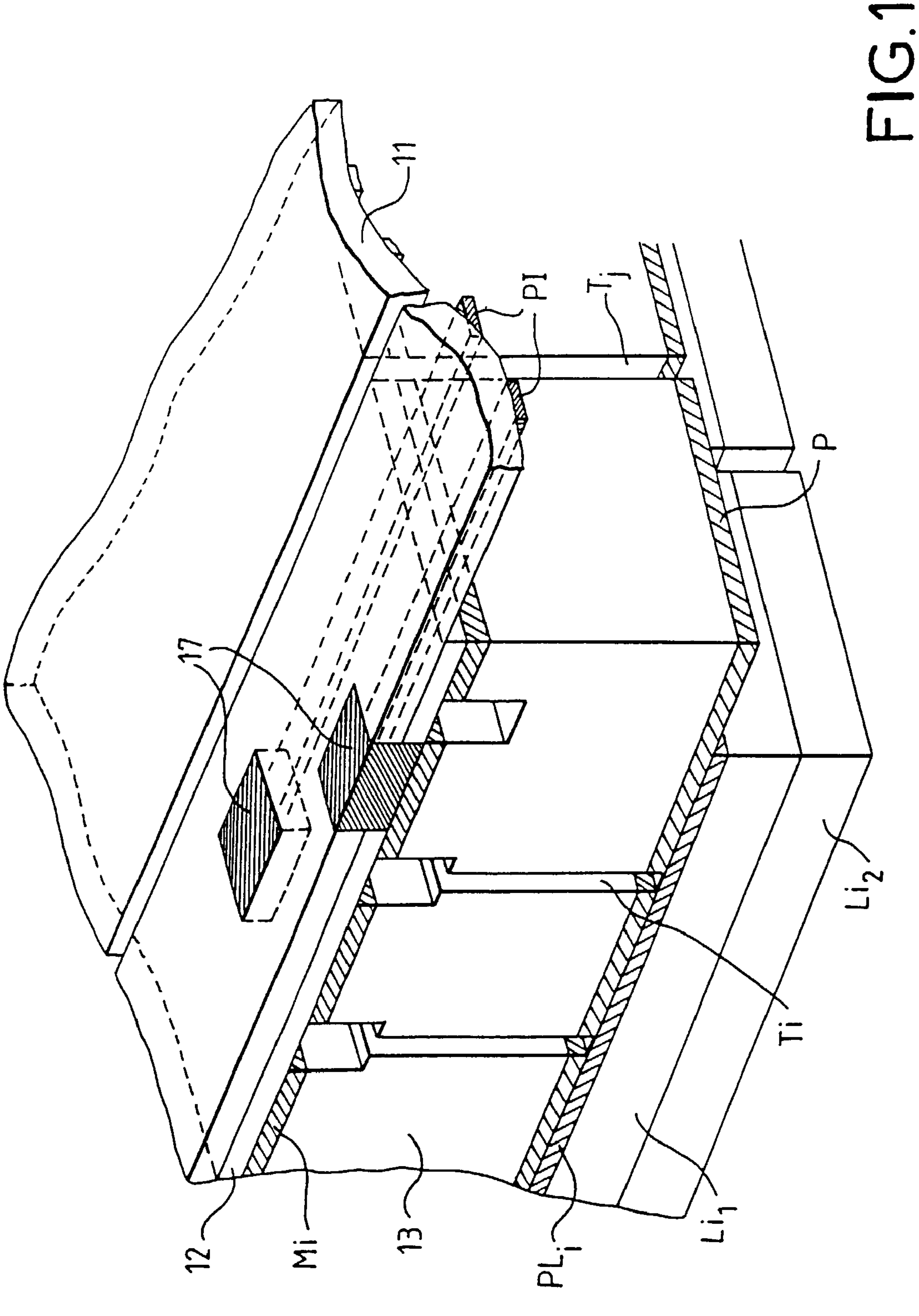
FIG. 1 illustrates a multi-element acoustic probe according to the prior art including a printed circuit and conducting tracks parallel to the acoustic pathways defined by the acoustic elements.
Figure 2:
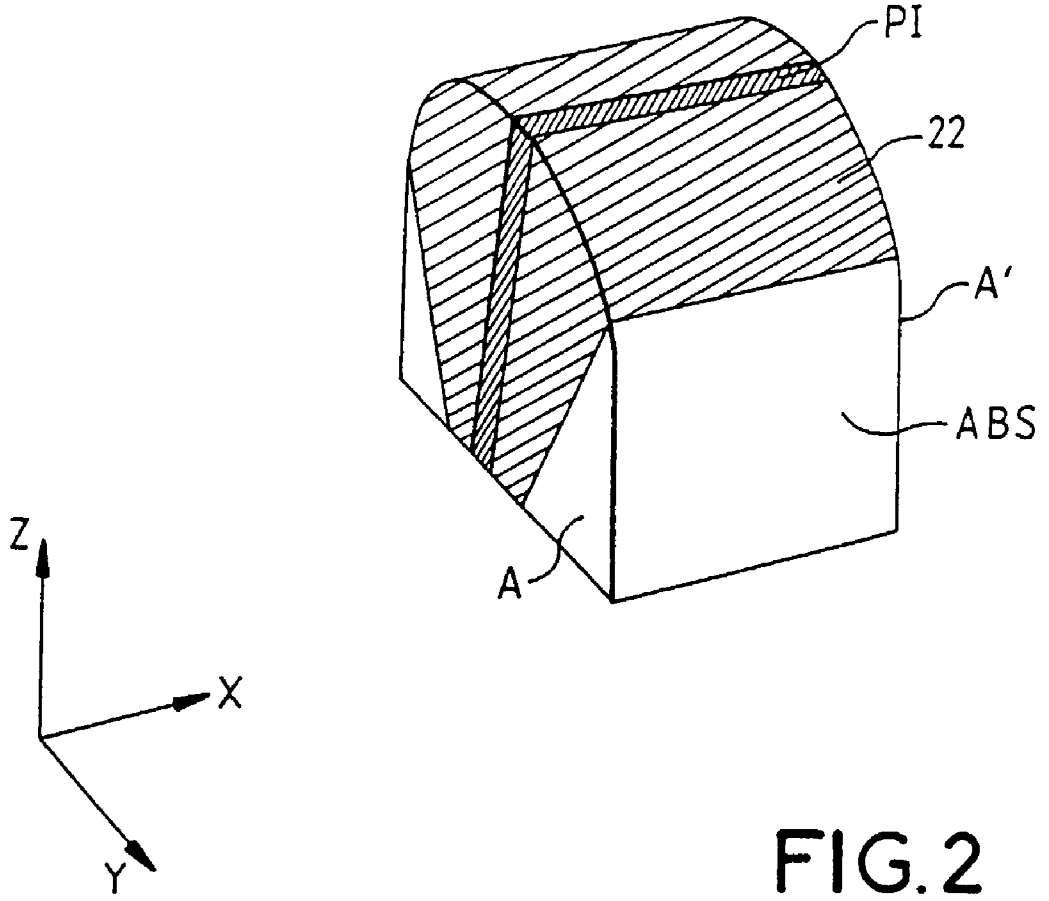
FIG. 2 depicts the printed circuit of an acoustic probe shaped over an absorber and using the acoustic elements as illustrated in FIG. 1, of the prior art.
Figure 3A:
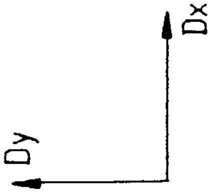
FIG. 3*a* illustrates a top view of an exemplary probe according to the invention.
Figure 3A:
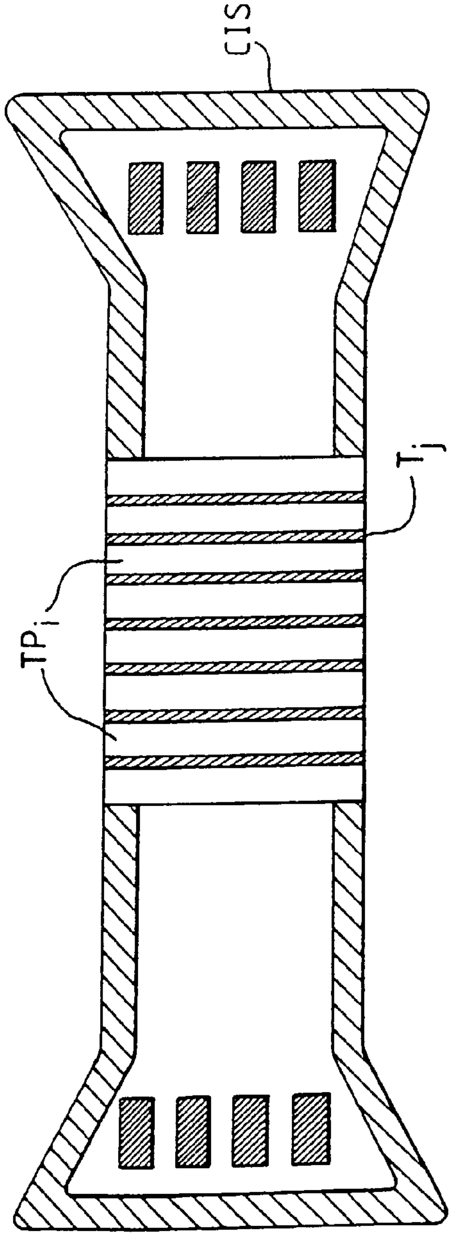
Figure 3B:
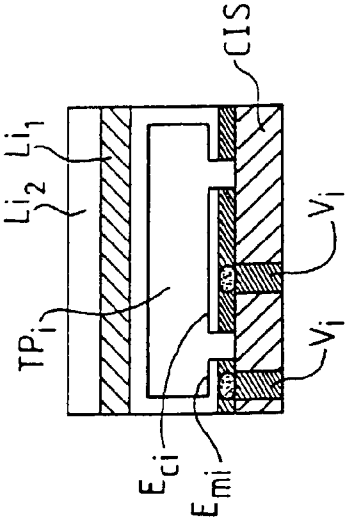
FIG. 3*b* illustrates a sectional view of the exemplary probe illustrated in FIG. 3*a;*

FIG. 3*a* illustrates a probe according to the invention seen from the top. FIG. 3*b* illustrates the same probe seen in section along the axis CC'. The piezoelectric transducer elements $TP_i$ consist of a piezoelectric material which may be a ceramic and are separated by cutouts $T_i$. Their surface is partly metallized so as to define a control electrode $E_{ci}$ and a ground electrode $E_{mi}$ for each of said transducers. These electrodes are connected by conducting vias $V_i$ on the lower surface of the printed circuit CIS, as will be developed below. Conventionally, the upper surface of the ceramic is covered with acoustic matching elements $Li_1$ and $Li_2$, the electrical properties of which are chosen to provide good acoustic matching. The transducers are adhesively bonded to the surface of a flexible printed circuit CIS including predefined electrical connections. The linear transducers are thus defined parallel to the direction Dy shown in FIG. 3*a*.

Figure 4A:
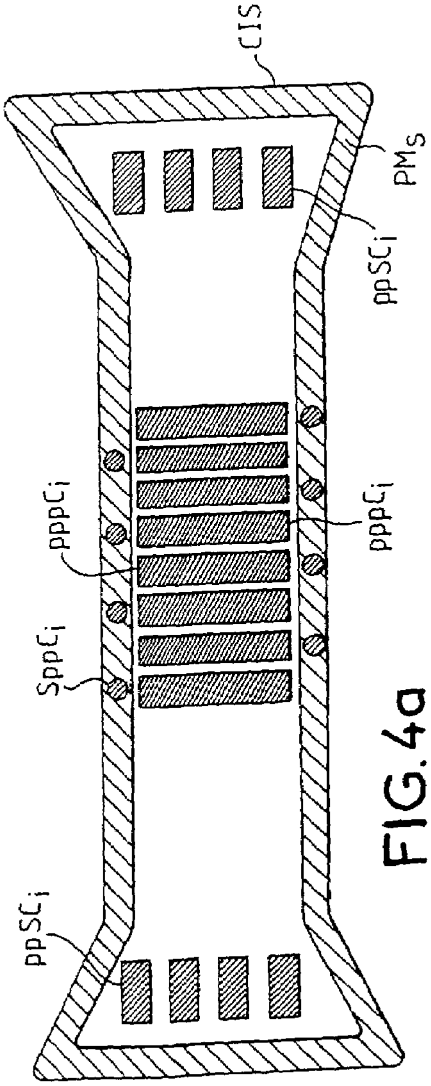
FIG. 4*a* illustrates a top view of a flexible printed circuit used in a probe according to the invention.
Figure 4B:
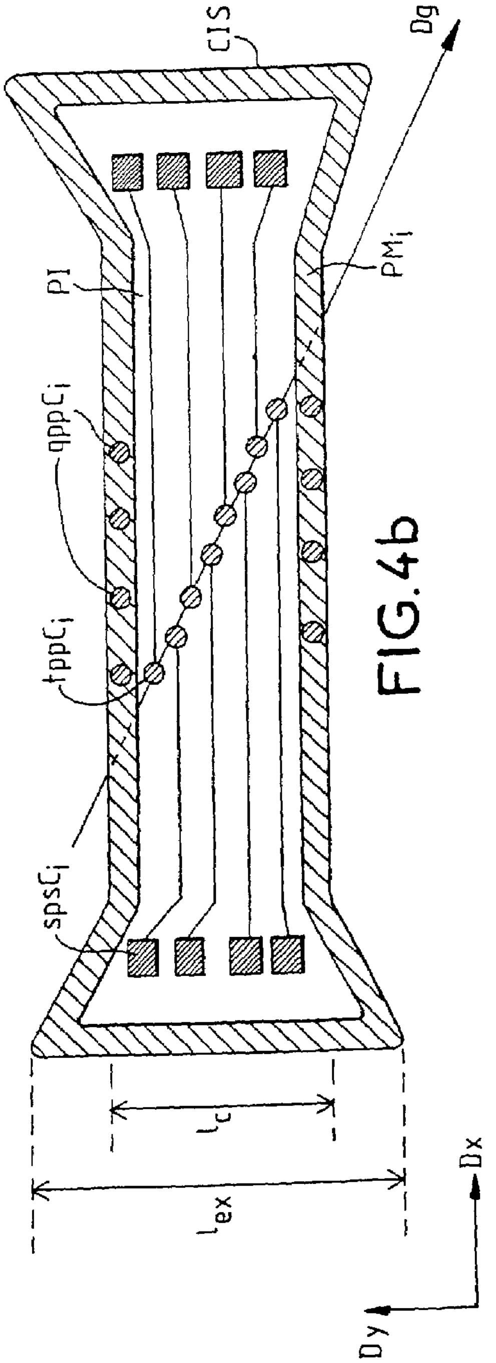
FIG. 4*b* illustrates a bottom view of the same flexible printed circuit used in a probe according to the invention.

FIGS. 4*a* and 4*b* illustrate respectively a top view of the printed circuit and bottom view of the said circuit, the surface seen from the top being in contact with the piezoelectric material.

More specifically, FIG. 4*a* shows, in the central part of the flexible printed circuit CIS, first primary connection pads $pppc_i$ for electrically connecting the control electrodes $Ec_i$ of the transducers, second primary connection pads $sppc_i$ in contact with the ground electrodes $Em_i$ of the transducers $TP_i$ and first secondary connection pads $ppsc_i$, the second primary connection pads $sppc_i$ correspond to a ground pad $PM_s$ produced at the periphery of the flexible printed circuit. This ground pad is cut during the operation of cutting the piezoelectric material into linear transducers since this cutting takes place on the matching plate/piezoelectric material assembly, the cutting extending into the flexible printed circuit and in this way leading to separating the ground pad prepared on the periphery of the upper surface of the flexible printed circuit into second primary connection pads $sppc_i$.

The lower surface of the flexible printed circuit illustrated in FIG. 4*b* comprises third primary connection pads $tppc_i$ facing the first primary connection pads $pppc_i$ and connected thereto by means of conducting vias. It also comprises second secondary connection pads $spsc_i$ connected to the pads $tppc_i$ by means of conducting tracks PI in a direction Dx and connected by means of conducting vias to the first secondary connection pads $ppsc_i$, from which it becomes possible to address the control electrodes of the piezoelectric transducers $TP_i$.

Moreover, conducting vias through the flexible printed circuit enable the second primary connection pads $sppc_i$ to be connected to the ground pad $PM_i$ made at the periphery of the flexible printed circuit on its lower surface and thus to provide the ground contact for the set of piezoelectric transducers $TP_i$.

Advantageously, the dielectric film has a peripheral width $l_{ex}$ which is greater than its central width $l_c$.

Such a configuration makes it possible to increase the pitch between the second connection pads with respect to the pitch between the primary connection pads.

Moreover, the connection pads in contact with the ground electrodes and the connection pads in contact with the control electrodes are distributed over the flexible dielectric film so that the conducting vias can equally advantageously be distributed in a direction Dg making an angle of about 45° with the direction D, so that there is no zone where the conducting vias overlap each other.

Assembly Step

In general, the ceramic piezoelectric material can be assembled onto the flexible printed circuit by adhesive bonding using an anisotropic conducting adhesive film (ACF). The ACE is a polymer film filled with metallized or metal polymer balls. The electrical conductivity is achieved by crushing the balls along the conducting axis when adhesively bonding the ceramic under pressure onto the printed circuit.

It may also involve a polymer resin filled with metallized or metal polymer balls. Electrical conductivity is also obtained by crushing the balls along the conducting axis when adhesively bonding under pressure.

According to another variant of the invention, the electrical contact may also be provided by using an isotropic conducting resin or an isotropic conducting film comprising a polymer filled for example to 80% with metal particles of the silver, nickel, etc. type. The electrical conductivity, which is in this case isotropic, is provided by the physical contact between the metal particles.

Cutting Step

The linear piezoelectric transducers can be cut from the piezoelectric material covered with its matching plates, using a diamond saw, in the direction Dy illustrated in FIG. 3*a*.

Typically, the width of a linear transducer may vary between 50 and 500 microns. To electrically isolate the linear transducers, the cutting lines stop in the thickness of the dielectric film.

Rather than using a diamond saw, it is also possible to carry out laser cutting of the various elements.

It is also possible to combine the two types of cutting. Thus the acoustic matching plates can be cut by laser, while the piezoelectric ceramic is cut using the mechanical saw. The latter cutting method makes it possible to free the thermal stresses due to the adhesive bonding of materials having very different thermal expansion coefficients. By initially cutting the acoustic matching plates, the ceramic is freed from thermal stresses and consequently, breaking of the ceramic during the second cutting is avoided.

The preceding steps can be carried out collectively. This is because a set of primary and secondary connection pads can be prepared on a same flexible dielectric film and intended for several acoustic probes as illustrated in FIG. 5, which shows a top view of said dielectric film.

On a dielectric film also called a flexible printed circuit CIS, various ground pads are prepared on the upper face of said flexible circuit, together with the necessary primary and secondary connection pads; in this case only the ground pads PMs are shown. Once the set of electrical connections (connection pad, metallization, conducting via) is produced on the flexible printed circuit assembly, various solid piezoelectric materials are adhesively bonded locally. As shown in FIG. 5, an example of 6 ceramic plates can be adhesively bonded onto the flexible printed circuit, together with six pairs of acoustic matching plates on said six ceramic plates. A collective cutting step is then carried out. Typically, series of probes, which are aligned vertically in FIG. 5, can be cut into individual elements in a single step, as illustrated by the dot-dash lines in FIG. 5.

Figure 5:
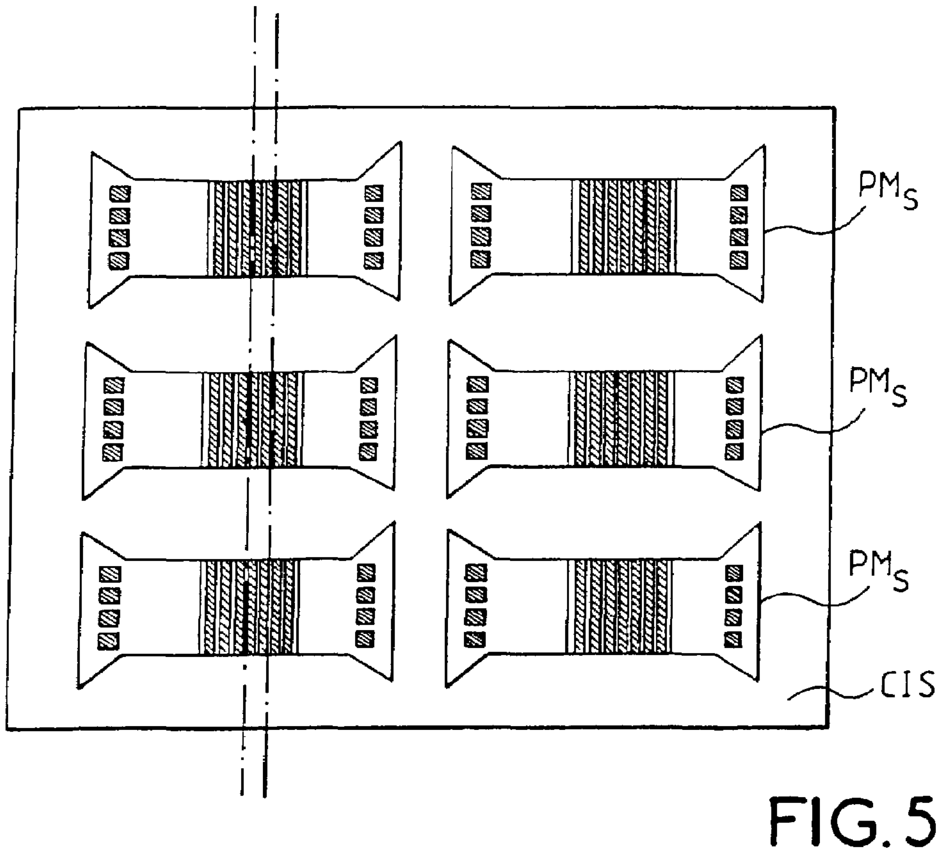
FIG. 5 illustrates a step in the method of the collective manufacture of probes according to the invention.

After the step of collectively cutting the linear piezoelectric transducers, each of the acoustic probes is cut around the ground planes $PM_s$ illustrated in FIG. 5.

Thus the collectivization makes it possible to reduce the manufacturing costs.

Shaping Step

Figure 6:
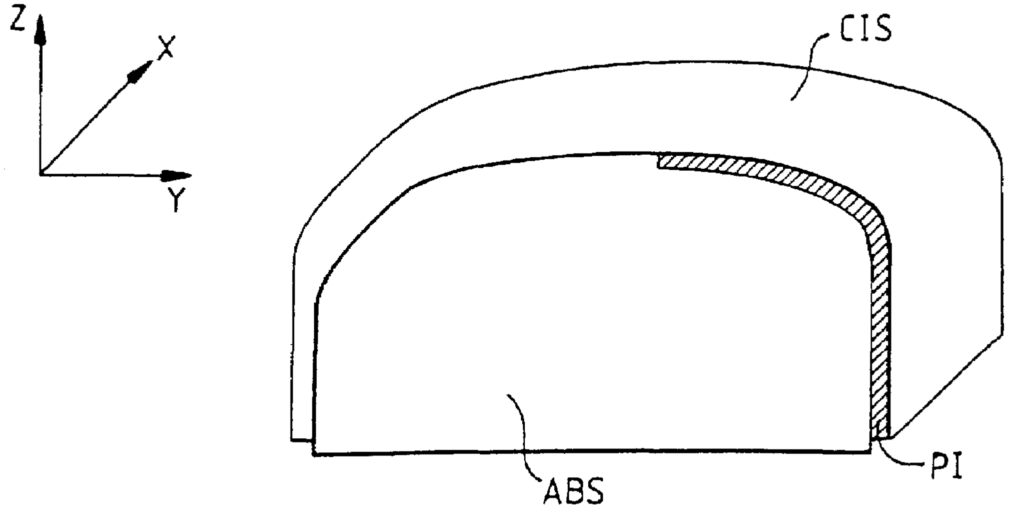
FIG. 6 illustrates a probe according to the invention, shaped over an absorber.

In general, the shaping operation is the one which makes it possible to produce curved probes. According to the invention, by virtue of the flexible dielectric film used and the prior cutting of the linear transducers, enough curvature of said dielectric film is obtained in order to assemble it on the surface of an absorber with a curved surface. In this respect, FIG. 6 shows the assembly of the flexible film CIS on the surface of the absorber ABS and also clearly illustrates that in this configuration, the electrical connection tracks PI are no longer folded with a sharp angle of 90° but are only subject to a slight curvature, so that they are no longer weakened as was the case in the prior art.

What is claimed is:

1. A unidirectional acoustic probe comprising:

linear piezoelectric transducers on a surface of a dielectric film, said dielectric film comprising connection elements configured to electrically connect said piezoelectric transducers to a control device, wherein the connection elements comprise:

primary connection pads, facing the piezoelectric transducers, secondary connection pads, offset with respect to the piezoelectric transducers, so that said piezoelectric transducers can be connected to the control device, and conducting tracks connecting the primary connection pads to the secondary connection pads, said conducting tracks being in a direction perpendicular to a direction defined by a major axis of the piezoelectric transducers.

2. The acoustic probe as claimed in claim 1, wherein each piezoelectric transducer comprises a control electrode and a ground electrode, and wherein the dielectric film comprises:

on an upper face, first primary connection pads in contact with the control electrodes, first secondary connection pads, and second primary connection pads in contact with the ground electrode;

on a lower face, third primary connection pads connected to the first primary connection pads by first conducting vias, second secondary connection pads connected to the first secondary connection pads by second conducting vias and connected to the third primary connection pads by said conducting tracks, and fourth primary connection pads connected to the second primary connection pads by third conducting vias.

3. The acoustic probe as claimed in claim 2, wherein the second primary connection pads form part of a conducting region located at a periphery of the upper face of the dielectric film and the fourth primary connection pads form part of a conducting region located at a periphery of the lower face of the dielectric film.

4. The acoustic probe as claimed in claim 1, wherein the linear piezoelectric transducers are covered with acoustic matching elements.

5. The acoustic probe as claimed in claim 4, wherein the acoustic matching elements comprise superposition of two series of acoustic matching elements.

6. The acoustic probe as claimed in claim 4, wherein a surface of the piezoelectric transducers is metallized to provide pick-up for the ground electrode located on an upper surface of the piezoelectric transducers, in a plane of a lower surface of the piezoelectric transducers, the plane comprising the control electrodes for controlling the piezoelectric transducers.

7. The acoustic probe as claimed in claim 1, further comprising an anisotropic conducting film providing an electrical and mechanical contact between the piezoelectric transducers and a printed circuit.

8. The acoustic probe as claimed in claim 1, further comprising a polymer resin filled with metallized or metal polymer balls providing the electrical and mechanical contact between the piezoelectric transducers and a printed circuit.

9. The acoustic probe as claimed in claim 1, further comprising an isotropic conducting resin or an isotropic conducting film comprising a polymer heavily filled with metal particles providing electrical and mechanical contact between the piezoelectric transducers and a printed circuit.

10. The acoustic probe as claimed in claim 1, further comprising a solid material absorbing acoustic waves, and supporting the dielectric film.

* * * * *

UNITED STATES PATENT AND TRADEMARK OFFICE
CERTIFICATE OF CORRECTION

PATENT NO. : 6,954,024 B2
DATED : October 11, 2005
INVENTOR(S) : Nguyen et al.

It is certified that error appears in the above-identified patent and that said Letters Patent is hereby corrected as shown below:

<u>Title page,</u>
Insert Item:
-- [30] Foreign Application Priority Data
Mar. 14, 2000 (FR) 00 03253 --.

Signed and Sealed this

Twenty-fourth Day of January, 2006

JON W. DUDAS
*Director of the United States Patent and Trademark Office*